(12) United States Patent
Nobusawa

(10) Patent No.: US 6,287,911 B1
(45) Date of Patent: Sep. 11, 2001

(54) SEMICONDUCTOR DEVICE WITH SILICIDE LAYERS AND FABRICATION METHOD THEREOF

(75) Inventor: Hajime Nobusawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/260,349

(22) Filed: Mar. 2, 1999

(30) Foreign Application Priority Data

Mar. 3, 1998 (JP) .................................................. 10-050386

(51) Int. Cl.[7] ..................... H01L 21/8242; H01L 21/336; H01L 29/792
(52) U.S. Cl. ........................... 438/241; 438/239; 438/238; 438/258; 257/326
(58) Field of Search ..................................... 438/241, 239, 438/238, 258, 257; 257/300, 298, 296, 314, 326

(56) References Cited

U.S. PATENT DOCUMENTS 5,998,252 * 12/1999 Huang ................................. 438/241

FOREIGN PATENT DOCUMENTS

| 62-104078 | 5/1987 | (JP) . |
| 63-3447 | 1/1988 | (JP) . |
| 1-264257 * | 10/1989 | (JP) . |
| 9-64294 | 3/1997 | (JP) . |
| 9-181269 | 7/1997 | (JP) . |
| 026903 | 4/1999 | (KP) . |

* cited by examiner

*Primary Examiner*—Wael Fahmy
*Assistant Examiner*—Neal Berezny

(57) ABSTRACT

A semiconductor device is provided, which is capable of high-speed operation of MOSFETs in a device section while suppressing the current leakage of MOSFETs in another device section even if the device is further miniaturized. This device is comprised of a semiconductor substrate, a first section defined on the substrate, a second section defined on the substrate, and a dielectric masking layer covering the first section while uncovering the second section. The first section includes a first MOSFET with a first pair of source/drain regions, a first gate insulating layer formed on the substrate, and a first gate electrode formed on the first gate insulating layer. No silicide layer is incorporated in each of the first pair of source/drain regions. The first MOSFET is covered with the masking layer in such a way that the first pair of source/drain regions of the first MOSFET are contacted with the masking layer. The second section includes a second MOSFET with a second pair of source/drain regions, a second gate insulating layer, formed on the substrate, and a second gate electrode formed on the second gate insulating layer. A silicide layer is incorporated in each of the second pair of source/drain regions.

5 Claims, 4 Drawing Sheets

SEMICONDUCTOR DEVICE WITH SILICIDE LAYERS AND FABRICATION METHOD THEREOF

BACKGROUND OF THE INVENTION

1. Field of the Invention

The present invention relates to a semiconductor device with silicide layers and a fabrication method thereof and more particularly, to a semiconductor device equipped with at least two sections necessitating different electric characteristics or performance of built-in electronic elements/circuits, such as a logic circuit section, a Dynamic Random-Access-Memory (DRAM) cell section, a peripheral or control circuit section of DRAM cells, and so on, and a fabrication method of the device.

2. Description of the Prior Art

Conventionally, a semiconductor device equipped with a logic circuit section including logic circuits such as sensing amplifiers and a DRAM cell section including an array of DRAM cells is known, which has been practically used in various application fields. Not only the logic circuits but also the DRAM cells are typically formed by Metal-Oxide-Semiconductor Field-Effect Transistors (MOSFETs).

In the semiconductor devices of this sort, to increase the operation speed of the logic circuits provided in the logic circuit section, silicide layers of a refractory metal such as tungsten (W), titanium (Ti), molybdenum (Mo), cobalt (Co), and nickel (Ni) need to be incorporated into source/drain regions and gate electrodes of MOSFETs that constitute the logic circuits. This is because the refractory-metal silicide layers are lower in electric resistance than single-crystal silicon (Si) and polysilicon layers.

Typically, the refractory-metal silicide layers are produced by a chemical reaction of a refractory metal with Si during a heat treatment process, which is termed a "silicidation reaction". Therefore, not only the logic circuit section but also the DRAM cell section, which are located on a same silicon substrate, are subjected to the heat treatment process. Thus, the refractory-metal silicide layers are incorporated in the source/drain regions and the gate electrodes of the MOSFETs in both the logic circuit section and the DRAM cell section.

The refractory-metal silicide layers incorporated in the source/drain regions in the DRAM cell section tend to increase the current leakage at the p-n junctions of the relating source/drain regions. Therefore, there arises a problem that the data-storing characteristic or performance of the DRAM cells is degraded.

To solve this problem, a configuration shown in FIG. 1 may be thought. In this configuration, a patterned isolation dielectric 119 is formed on a main surface of a p-type single-crystal Si substrate 101, thereby defining a logic circuit section 120 having n-channel MOSFETs 121 and a DRAM cell section 130 having n-channel MOSFETs 131 and storage capacitors 132. For the sake of simplification of description, one of the MOSFETs 121, one of the MOSFETs 131, and one of the capacitors 132 are shown in FIG. 1, and explanation about only these three elements is presented below.

In the logic circuit section 120, a pair of $n^+$-type diffusion regions 109b and a pair of $n^-$-type diffusion regions 110b are formed in the substrate 101, thereby forming a pair of source/drain regions 104b and 105b with the Lightly-Doped Drain (LDD) structure. One of the two diffusion regions 109b located at the right-hand side and the adjoining diffusion region 110b form the source/drain region 104b. The other of the two diffusion regions 109b located at the left-hand side and the adjoining diffusion region 110b form the source/drain region 105b.

A gate insulating layer 102b is formed on the main surface of the substrate 101 between the pair of $n^+$-type diffusion regions 109b. The gate insulating layer 102b is overlapped with the underlying pair of $n^-$-type diffusion regions 110b. A polysilicon layer 103b and a pair of sidewall spacers 114b are formed on the gate insulating layer 102b. The pair of sidewall spacers 114b are located at each side of the polysilicon layer 103b. Further, a silicide layer 112b of a refractory metal is formed on the polysilicon layer 103b to be sandwiched by the sidewall spacers 114b. The silicide layer 112b and the polysilicon layer 103b serves as a gate electrode 118b.

The pair of source/drain regions 104b and 105b, the gate insulating layer 102b, the gate electrode 118b, and the pair of sidewall spacers 114b constitute the MOSFET 121.

In the DRAM cell section 130, a pair of $n^+$-type diffusion regions 109a and a pair of $n^-$-type diffusion regions 110a are formed in the substrate 101, thereby forming a pair of source/drain regions 104a and 105a with the LDD structure. One of the two diffusion regions 109a located at the right-hand side and the adjoining diffusion region 110a form the source/drain region 104a. The other of the two diffusion regions 109a located at the left-hand side and the adjoining diffusion region 110a form the source/drain region 105a.

A gate insulating layer 102a is formed on the main surface of the substrate 101 between the pair of $n^+$-type diffusion regions 109a. The gate insulating layer 102a is overlapped with the underlying pair of $n^-$-type diffusion regions 110a. A polysilicon layer 103a and a pair of sidewall spacers 114a are formed on the gate insulating layer 102a. The pair of sidewall spacers 114a are located at each side of the polysilicon layer 103b. Further, a silicide layer 112a of a refractory metal is formed on the polysilicon layer 103a. The silicide layer 112a and the polysilicon layer 103a serves as a gate electrode 118a.

The pair of source/drain regions 104a and 105a, the gate insulating layer 102a, the gate electrode 118a, and the pair of sidewall spacers 114a constitute the MOSFET 131.

Further, an n-type diffusion region 108 is formed in the substrate 101 to be contacted with the $n^+$-type diffusion region 109a located at the right-hand side and the isolation dielectric 119. The diffusion region 108 serves as a lower electrode of the capacitor 132. A capacitor dielectric layer 107 is selectively formed on the diffusion region 108. A conductive layer 106 is selectively formed on the isolation dielectric 119 to be contacted with the capacitor dielectric layer 107. The conductive layer 106 serves as an upper electrode of the capacitor 132.

The capacitor 132 is electrically connected to the MOSFET 131 at the contact area of the diffusion regions 108 and 109a.

With the device configuration shown in FIG. 1, since no silicide layer is incorporated in the source/drain regions 104a and 105a of the MOSFET 131 in the DRAM cell section 130, the above-described problem that the data-storing characteristic or performance of the DRAM cells is degraded can be solved. However, in this case, there arises anther problem that the operation speed of the logic circuits (i.e., the MOSFET 121) in the logic circuit section 120 is not satisfactorily high.

Thus, it is necessary to develop a technique enabling the selective silicidation reaction of the source/drain regions in the logic circuit section 120 and the DRAM cell section 130.

An example of the selective silicidation technique is shown in FIGS. 2A to 2C, which is substantially the same as that disclosed in the Japanese Non-Examined Patent Publication No. 1-264257 published in October 1989.

In the conventional selective silicidation technique disclosed in the Japanese Non-Examined Patent Publication No. 1-264257, as shown in FIG. 2C, a patterned isolation dielectric 219 is formed on a main surface of a p-type single-crystal Si substrate 201, thereby defining a logic circuit section 220 having an n-channel MOSFET 221 and a DRAM cell section 230 having an n-channel MOSFET 231 and a storage capacitor 232.

In the logic circuit section 220, a pair of $n^+$-type diffusion regions 209b and a pair of $n^-$-type diffusion regions 210b are formed in the substrate 201 and at the same time, silicide layers 212c of a refractory metal are formed on the $n^+$-type diffusion regions 209b. Thus, a pair of source/drain regions 204b and 205b with the LDD structure are formed. One of the two diffusion regions 209b located at the right-hand side, the overlying silicide layer 212c, and the adjoining diffusion region 210b form the source/drain region 204b. The other of the two diffusion regions 209b located at the left-hand side, the overlying silicide layer 212c, and the adjoining diffusion region 210b form the source/drain region 205b. Thus, the silicide layers 212c are incorporated in the source/drain regions 204b and 205b in the logic circuit section 220.

A gate insulating layer 202b is formed on the main surface of the substrate 201 between the pair of $n^+$-type diffusion regions 209b. The gate insulating layer 202b is overlapped with the underlying pair of $n^-$-type diffusion regions 210b. A polysilicon layer 203b and a pair of sidewall spacers 214b are formed on the gate insulating layer 202b. The pair of sidewall spacers 214b are located at each side of the polysilicon layer 203b. Further, in addition to the silicide layers 212c formed on the $n^+$-type diffusion regions 209b, a silicide layer 212b is formed on the polysilicon layer 203b to be sandwiched by the sidewall spacers 214b. The silicide layer 212b and the polysilicon layer 203b serves as a gate electrode 218b.

The pair of source/drain regions 204b and 205b, the gate insulating layer 202b, the gate electrode 218b, and the pair of sidewall spacers 214b constitute the MOSFET 221 in the logic circuit section 220.

In the DRAM cell section 230, a pair of $n^+$-type diffusion regions 209a and a pair of $n^-$-type diffusion regions 210a are formed in the substrate 201, thereby forming a pair of source/drain regions 204a and 205a with the LDD structure. One of the two diffusion regions 209a located at the right-hand side and the adjoining diffusion region 210a form the source/drain region 204a. The other of the two diffusion regions 209a located at the left-hand side and the adjoining diffusion region 210a form the source/drain region 205a.

Thus, unlike the MOSFET 221 in the logic circuit section 220, the MOSFET 231 in the DRAM cell section 230 has no silicide layers incorporated in the source/drain regions 204a and 205a.

A gate insulating layer 202a is formed on the main surface of the substrate 201 to cover the pair of $n^+$-type diffusion regions 209a. The gate insulating layer 202a is overlapped with the underlying pairs of diffusion regions 209a and 210a. A polysilicon layer 203a and a pair of sidewall spacers 214a are formed on the gate insulating layer 202a. The pair of sidewall spacers 214a are located at each side of the polysilicon layer 203b. Further, a silicide layer 212a is formed on the polysilicon layer 203a. The silicide layer 212a and the polysilicon layer 203a serves as a gate electrode 218a.

The pair of source/drain regions 204a and 205a, the gate insulating layer 202a, the gate electrode 218a, and the pair of sidewall spacers 214a constitute the MOSFET 231 in the DRAM cell section 230.

Further, an n-type diffusion region 208 is formed in the substrate 201 to be contacted with the $n^+$-type diffusion region 209a located at the right-hand side and with the adjoining isolation dielectric 219. The diffusion region 208 serves as a lower electrode of the capacitor 232. A conductive layer 206 is selectively formed on the isolation dielectric 219 to be contacted with the gate insulating layer 202a. The conductive layer 106 serves as an upper electrode of the capacitor 232. A part of the gate insulating layer 202a, which is sandwiched by the diffusion region 208 and the conductive layer 206, serves as a capacitor dielectric of the capacitor 232.

The capacitor 232 is electrically connected to the MOSFET 231 at the contact area of the diffusion regions 208 and 209a.

With the device configuration shown in FIG. 2C, since the source/drain regions 204a and 205a and 204b and 205b have the LDD structure, the channel regions of the MOSFETs 221 and 231 are able to be shortened while preventing the bad effects due to the hot carriers from occurring. Also, the gate electrodes 218a and 218b have the polycide structure, so the electric resistance of the gate electrodes 218a and 218b can be decreased, which contributes to the high-speed operation of the MOSFETs 221 and 231.

Moreover, the source/drain region 204a serving as a charge storage node in the DRAM cell section 230 has no silicide layer incorporated therein while the source/drain regions 204b and 205a in the logic circuit section 220 has the silicide layers 212c incorporated therein. Therefore, the parasitic resistance of the source/drain regions 204b and 205a in the logic circuit section 220 can be lowered and at the same time, malfunction due to the junction current leakage can be prevented from occurring.

The device configuration shown in FIG. 2C is fabricated in the following way.

First, as shown in FIG. 2A, the isolation dielectric 219 is formed on the substrate 201 to define the logic circuit section 220 and the DRAM cell section 230, and then, the gate insulating layers 202a and 202b are formed on the main surface of the substrate 201 in the two sections 220 and 230. Next, polysilicon and silicon nitride ($Si_3N_4$) are deposited successively by Chemical Vapor Deposition (CVD) processes on the gate insulating layers 202a and 202b. Then, the deposited polysilicon and $Si_3N_4$ are patterned to form the polysilicon layers 203a and 203b located respectively on the gate insulating layers 202a and 202b, and $Si_3N_4$ layers 213a and 213b located respectively on the polysilicon layers 202a and 202b. The state at this stage is shown in FIG. 2A.

Subsequently, using the polysilicon layers 203a and 203b as a mask, the pair of $n^-$-type diffusion regions 210a are formed in the substrate 201 at each side of the polysilicon layer 203a in the DRAM cell section 230 and the pair of $n^-$-type diffusion regions 210b are formed in the substrate 201 at each side of the polysilicon layer 203b in the logic circuit section 220 by an ion-implantation process, as shown in FIG. 2B. The $n^-$-type diffusion regions 210a are in self-alignment to the polysilicon layer 203a. The $n^-$-type diffusion regions 210b are in self-alignment to the polysilicon layer 203b.

After a silicon dioxide ($SiO_2$) layer (not shown) is formed to cover the whole substrate 201 by a CVD process, the $SiO_2$ layer thus formed is patterned by a Reactive Ion Etching (RIE) process, thereby forming the pair of sidewall spacers 214a on the gate insulating layer 202a and the pair of sidewall spacers 214b on the gate insulating layer 202b. The pair of sidewall spacers 214a are located at each side of the polysilicon layer 203a, and the pair of sidewall spacers 214b are located at each side of the polysilicon layer 203b.

Using the polysilicon layers 203a and 203b and the sidewall spacers 214a and 214b as a mask, an n-type dopant is introduced by an ion-implantation process into the substrate 201 to be overlapped with the $n^-$-type diffusion regions 210a and 210b, thereby forming the pair of $n^+$-type diffusion regions 209a at each side of the polysilicon layer 203a in the DRAM cell section 230 and the pair of $n^+$-type diffusion regions 209b at each side of the polysilicon layer 203b in the logic circuit section 220, as shown in FIG. 2B. The $n^+$-type diffusion regions 209a are in self-alignment to the polysilicon layer 203a and the sidewall spacers 214a. The $n^+$-type diffusion regions 209b are in self-alignment to the polysilicon layer 203b and the sidewall spacers 214b.

After the $Si_3N_4$ layers 213a and 213b located on the polysilicon layers 203a and 203b are removed, the gate insulating layer 202b existing in the logic circuit section 220 is selectively removed, thereby exposing selectively the main surface of the substrate 201, i.e., the surfaces of the $n^+$-type diffusion regions 209b. Then, a refractory metal layer (not shown) is formed to cover the whole substrate 201 by a sputtering process, in which the refractory metal layer is contacted with the surfaces of the $n^+$-type diffusion regions 209b. The substrate 201 with the refractory metal layer is subjected to a heat treatment process at approximately 600° C. to cause a silicidation reaction between the substrate 201 made of Si and the refractory metal layer. Thus, the silicide layers 212c are respectively formed on the $n^+$-type diffusion regions 209b and at the same time, the silicide layers 212a and 212b are respectively formed on the polysilicon layers 203a and 203b, as shown in FIG. 2C.

After the unreacted refractory metal layer is removed, finally, the substrate 201 with the silicide layers 212a, 212b, and 212c is subjected to a heat treatment process again at approximately 900° C., thereby causing a phase transition of the layers 212a, 212b, and 212c. As a result, the electric resistance of the silicide layers 212a, 212b, and 212c is lowered.

Through the above-described process steps, the device configuration as shown in FIG. 2C is obtained, in which the MOSFET 231 in the DRAM cell section 230 has no suicide layers incorporated in the source/drain regions 204a and 205a while the MOSFET 221 in the logic circuit section 220 has the silicide layers incorporated in the source/drain regions 204b and 205b.

With the fabrication method of the conventional device configuration shown in FIG. 2C, as seen from the above explanation, the gate insulating layer 202a in the DRAM cell section 230 is used as a masking layer for preventing the silicidation reaction from occurring at the $n^+$-type diffusion regions 209a during the silicidation process of the refractory film. Taking this masking purpose into consideration, the gate insulating layer 202a needs to have a thickness of approximately 100 Å or greater. On the other hand, the gate insulating layer 202a becomes thinner with the progressing miniaturization of the semiconductor device.

Therefore, there arises a problem that the gate insulating layer 202a tends to become unable to accomplish the desired masking purpose dependent upon the progressing miniaturization. If so, the $n^+$-type diffusion regions 209a in the DRAM cell section 230 tend to be silicided, resulting in increase in junction current leakage. This problem is referred as the first problem later.

Moreover, the fabrication method of the conventional device configuration shown in FIG. 2C has second and third problems explained below. Specifically, this fabrication method includes the process of removing selectively the gate insulating layer 202b in the logic circuit section 220. Typically, a photolithography technique is used for this selective removing process.

Also, if the source/drain regions 204a and 205a in the DRAM cell area 230 and the source/drain regions 204b and 205b in the logic circuit section 220 are planned to be separately formed, the DRAM cell area 230 will be covered with a photoresist film when the source/drain regions 204b and 205b are formed in the logic circuit section 220. Subsequently, the logic circuit section 220 will be covered with another photoresist film when the source/drain regions 204a and 205a are formed in the DRAM cell section 230.

Accordingly, there is the second problem that the number of the necessary photolithography processes is as much as four in total.

Additionally, most of the patterns located in the logic circuit section 220 are isolated ones while most of the patterns located in the DRAM cell section 230 are line-and-space ones. Therefore, these two sections 220 and 230 have different optimum exposure conditions for the processes to expose the photoresist films.

As a result, in the fabrication method of the conventional device structure shown in FIG. 2C where both the two sections 220 and 230 are exposed in a same process, there is the third problem that the gate electrodes 218a and 218b tend to be difficult or unable to be formed at a desired high accuracy with the progressing miniaturization of the semiconductor device.

Additionally, the Japanese Non-Examined Patent Publication No. 9-64294 published in March 1997 discloses a fabrication method of a semiconductor device with a DRAM cell section and a peripheral circuit section. However, this Publication discloses only the technique that silicide layers are incorporated in the source/drain regions of MOSFETs located in the peripheral circuit section while no silicide layers are incorporated in the source/drain regions of MOSFETs located in the DRAM cell section. This Publication discloses no way to incorporate the silicide layers in the source/drain regions of the MOSFETs located in the DRAM cell section and the peripheral circuit section.

As a result, the conventional method disclosed in the Japanese Non-Examined Patent Publication No. 9-64294 is unable to solve the above-described first to third problems.

The Japanese Non-Examined Patent Publication No. 9-181269 published in July 1997 discloses a fabrication method of a semiconductor device with a DRAM cell section and a logic circuit section. This Publication shows the technique that silicide layers are incorporated in the source/drain regions of MOSFETs and the gate electrodes thereof, including bit lines, in the logic circuit section. However, this Publication shows only the technique that silicide layers are incorporated in the bit lines in the DRAM cell section.

As a result, the conventional method disclosed in the Japanese Non-Examined Patent Publication No. 9-181269 is unable to solve the above-described first to third problems because of the complicated process sequence and the large number of necessary process steps.

SUMMARY OF THE INVENTION

Accordingly, an object of the present invention to provide a semiconductor device that is capable of high-speed operation of MOSFETs in a device section while suppressing the current leakage of MOSFETs in another device section even if the device is further miniaturized, and a fabrication method of the semiconductor device.

Another object of the present invention to provide a semiconductor device that decreases the number of necessary lithography processes to thereby lower the fabrication cost, and a fabrication method of the semiconductor device.

Still another object of the present invention to provide a semiconductor device that makes it possible to form gate electrodes at desired high accuracy in different sections even if the device is further miniaturized, and a fabrication method of the semiconductor device.

The above objects together with others not specifically mentioned will become clear to those skilled in the art from the following description.

According to a first aspect of the present invention, a semiconductor device is provided, which is comprised of a semiconductor substrate, a first section defined on the substrate, a second section defined on the substrate, and a dielectric masking layer covering the first section while uncovering the second section.

The first section includes a first MOSFET with a first pair of source/drain regions, a first gate insulating layer formed on the substrate, and a first gate electrode formed on the first gate insulating layer. No silicide layer is incorporated in each of the first pair of source/drain regions. The first MOSFET is covered with the masking layer in such a way that the first pair of source/drain regions of the first MOSFET are contacted with the masking layer.

The second section includes a second MOSFET with a second pair of source/drain regions, a second gate insulating layer formed on the substrate, and a second gate electrode formed on the second gate insulating layer. A silicide layer is incorporated in each of the second pair of source/drain regions.

With the semiconductor device according to the first aspect of the present invention, the dielectric masking layer covering the first section while uncovering the second section is provided, and the first MOSFET in the first section is covered with the masking layer in such a way that the first pair of source/drain regions of the first MOSFET are contacted with the masking layer.

Therefore, when the silicide layers are incorporated in the second pair of source/drain regions of the second MOSFET in the second section by a silicidation reaction, the first pair of source/drain regions of the first MOSFET are effectively covered or masked by the masking layer. This means that the first gate insulating layer of the first MOSFET is not used as a mask for preventing the silicidation reaction of the first pair of source/drain regions of the first MOSFET.

Accordingly, even if the first gate insulating layer of the first MOSFET becomes thinner due to further miniaturization of the semiconductor device, no silicide layers are incorporated in the second source/drain regions of the second MOSFET. Thus, the second MOSFET in the second section is capable of high-speed operation due to existence of the sulicide layers and at the same time, the current leakage of the first MOSFET in the first section is suppressed due to absence of the silicide layers.

Also, after the first MOSEET is formed in the first section and the masking layer is formed in the first section to cover the first MOSFET thus formed, the second MOSFET can be formed in the second section while covering the first section with the masking layer. Therefore, the number of necessary lithography processes can be smaller.

Moreover, after the first MOSFET is formed in the first section in a process sequence, the masking layer is formed in the first section to cover the first MOSFET thus formed. Then, the second MOSFET can be formed in the second section while covering the first section with the masking layer in another process sequence. As a result, the first and second gate electrodes of the first and second MOSFETs can be formed at desired high accuracy in the first and second sections even if the first and second gate electrodes are miniaturized due to further miniaturization of the semiconductor device.

In a preferred embodiment of the device according to the first aspect, a top of the first gate electrode of the first MOSFET is exposed from the masking layer. In this case, there is an additional advantage that a silicide layer can be readily incorporated in the first gate electrode of the first MOSFET.

In another preferred embodiment of the device according to the first aspect, a top of the first gate electrode of the first MOSFET is located in substantially a same plane as a surface of the masking layer. In this case, there is an additional advantage that the top of the first gate electrode of the first MOSFET can be readily exposed from the masking layer by a surface-polishing process of the masking layer.

In still another preferred embodiment of the device according to the first aspect, a top of the masking layer is located in substantially a same plane as a top of the second gate electrode of the second MOSFET. In this case, there is an additional advantage that the height of the first and second gate electrodes of the first and second MOSFETs can be readily accorded with one another.

According to a second aspect of the present invention, a fabrication method of a semiconductor device is provided, which is comprised of the following steps (a) to (d). This method is used for fabricating the semiconductor device according to the first aspect.

In the step (a), a first section and a second section are defined on a main surface of a semiconductor substrate.

In the step (b), a first gate insulating layer is formed on the main surface of the substrate in the first section and a second gate insulating layer is formed on the main surface of the substrate in the second section.

In the step (c), a conductive layer is formed on the first and second gate insulating layers to cover the first and second sections In the step (d), the conductive layer is patterned in the first section, thereby forming a first gate electrode on the first gate insulating layer in the first section without forming any gate electrode in the second section.

In the step (e), a first pair of source/drain regions are formed in the first section at each side of the first gate electrode, thereby constituting a first MOSFET in the first section.

In the step (f), a dielectric masking layer is selectively formed to cover the first section while uncovering the second section.

In the step (g), the remaining conductive layer in the second section is patterned while masking the first section by the masking layer, thereby forming a second gate electrode on the second gate insulating layer in the second section.

In the step (h), a second pair of source/drain regions are formed in the second section at each side of the second gate electrode, thereby constituting a second MOSFET in the second section.

In the step (i), a refractory metal layer is formed to cover the first and second sections in such a way that the refractory metal layer is contacted with the second pair of source/drain regions in the second section.

In the step (j), the substrate with the refractory metal layer is heat-treated to form a pair of silicide layers on the second pair of source/drain regions in the second section due to silicidation reaction of the refractory metal with the second pair of source/drain regions.

With the fabrication method according to the second aspect of the present invention, because of the same reason as that shown in the device according to the first aspect, when the silicide layers are incorporated in the pair of source/drain regions of the second MOSFET in the second section by a silicidation reaction in the step (j), the pair of source/drain regions of the first MOSFET are effectively covered or masked by the masking layer. This means that the first gate insulating layer of the first MOSFET is not used as a mask for preventing the silicidation reaction of the pair of source/drain regions of the first MOSFET.

Accordingly, even if the first gate insulating layer of the first MOSFET becomes thinner due to further miniaturization of the semiconductor device, no silicide layers are incorporated in the source/drain regions of the second MOSFET. Thus, the second MOSPET in the second section is capable of high-speed operation due to existence of the silicide layers and at the same time, the current leakage of the first MOSFET in the first section is suppressed due to absence of the silicide layers.

Also, after the first MOSFET is formed in the first section in the step (e) and the masking layer is formed in the first section to cover the first MOSFET thus formed in the step (f), the second MOSFET is formed in the second section while covering the first section with the masking layer in the step (h). Therefore, the number of necessary lithography processes can be smaller.

Moreover, after the first MOSFET is formed in the first section in the steps (b) to (e), the masking layer is formed in the first section to cover the first MOSFET thus formed in the step (f). Then, the second MOSFET is formed in the second section while covering the first section with the masking layer in the steps (g) and (h) As a result, the gate electrodes of the first and second MOSFETs can be formed at desired high accuracy in the first and second sections even if the first and second gate electrodes of the first and second MOSFETs are miniaturized due to further miniaturization of the semiconductor device.

In a preferred embodiment of the method according to the second aspect, the step (f) is carried out by a substep of forming the masking layer to cover the whole substrate and a substep of planarizing the masking layer until a top of the first gate electrode of the first MOSFET is exposed from the masking layer. In this case, there is an additional advantage that end detection of the substep of planarizing the masking layer can be readily performed, and that a silicide layer is readily incorporated in the first gate electrode in the step (j).

In another preferred embodiment of the method according to the second aspect, the step (f) is carried out in such as way that a top of the first gate electrode of the first MOSFET is located in substantially a same plane as a surface of the masking layer. In this case, there is an additional advantage that the top of the gate electrode of the first MOSFET can be readily exposed from the masking layer by a surface-polishing process of the masking layer.

In still another preferred embodiment of the method according to the second aspect, the step (h) is carried out in such as way that a top of the masking layer is located in substantially a same plane as a top of the second gate electrode of the second MOSFET. In this case, there is an additional advantage that the height of the first and second gate electrodes of the first and second MOSFETs can be readily accorded with one another.

BRIEF DESCRIPTION OF THE DRAWINGS

In order that the present invention may be readily carried into effect, it will now be described with reference to the accompanying drawings.

DETAILED DESCRIPTION OF THE PREFERRED EMBODIMENTS

Figure 1:
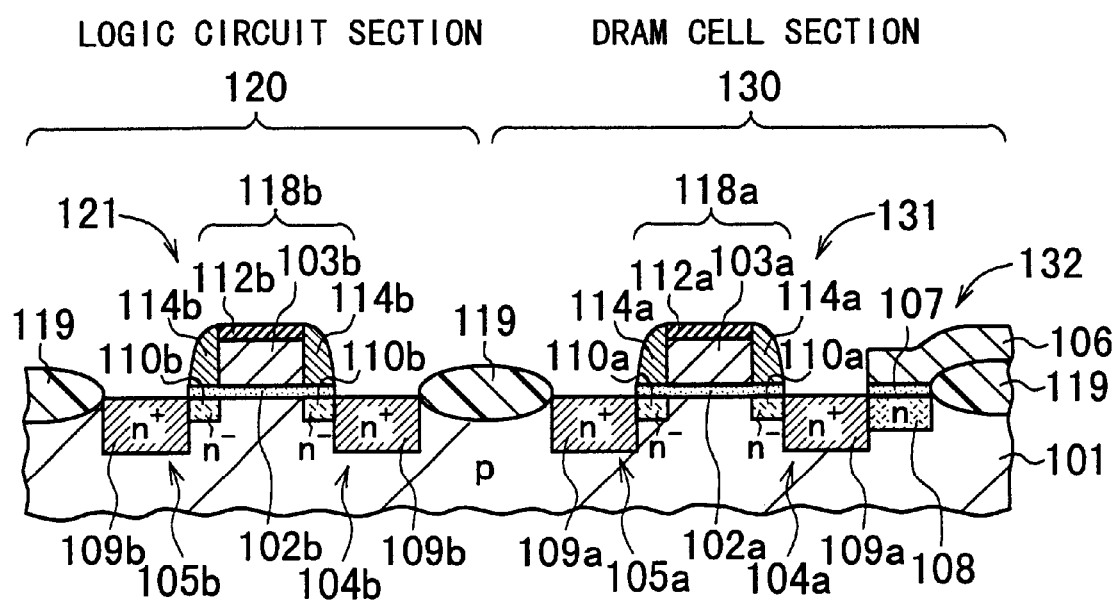
FIG. 1 is a cross-sectional view showing the configuration of a conventional semiconductor device.

Preferred embodiments of the present invention will be described in detail below while referring to the drawings attached.

Figure 3A:
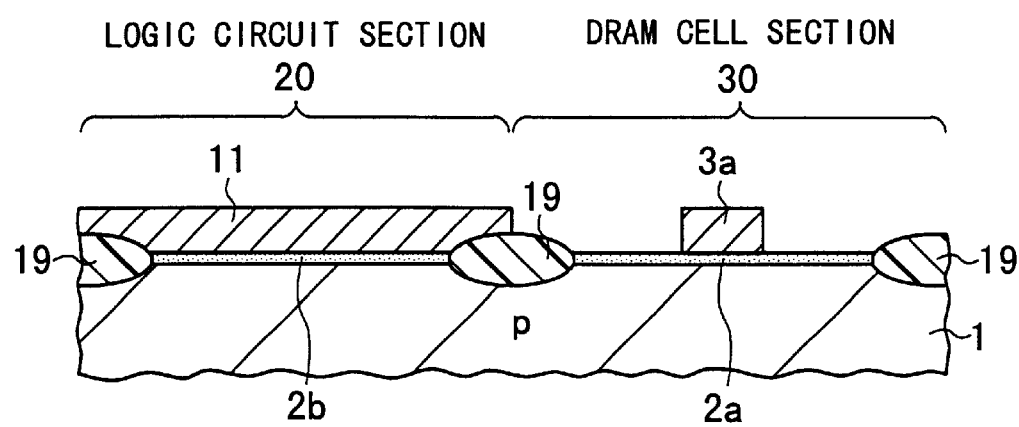
FIGS. 3A to 3F are cross-sectional views showing a fabrication method of a semiconductor device according to an embodiment of the present invention, respectively.
Figure 3B:
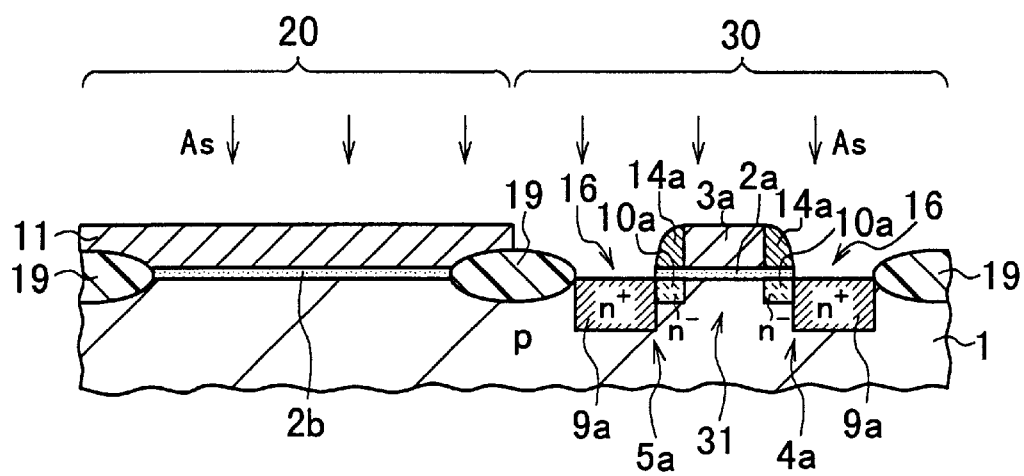
Figure 3C:
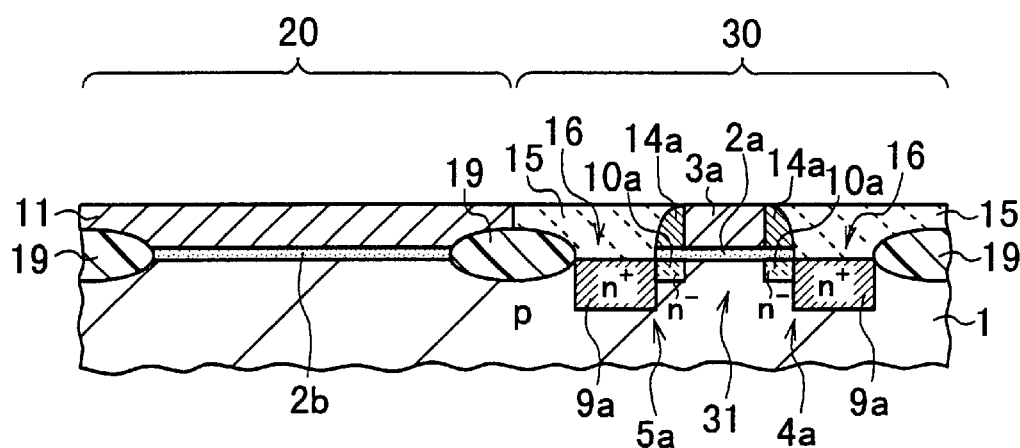
Figure 3D:
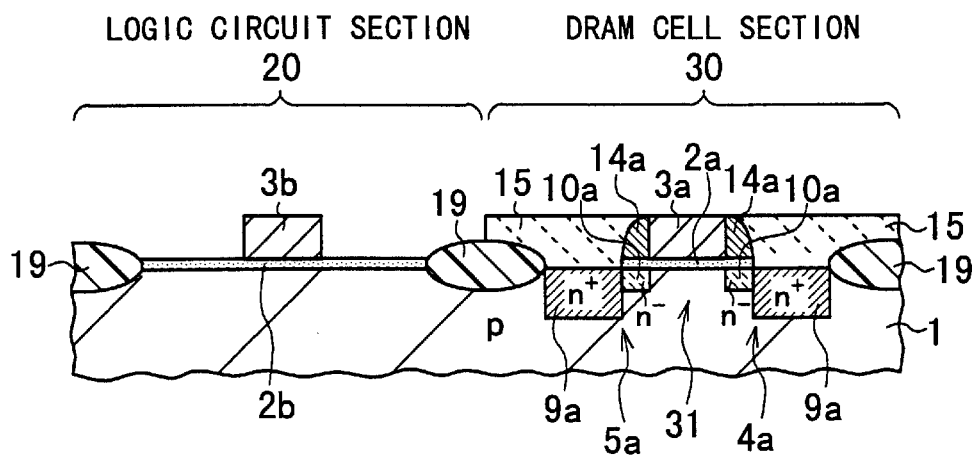
Figure 3E:
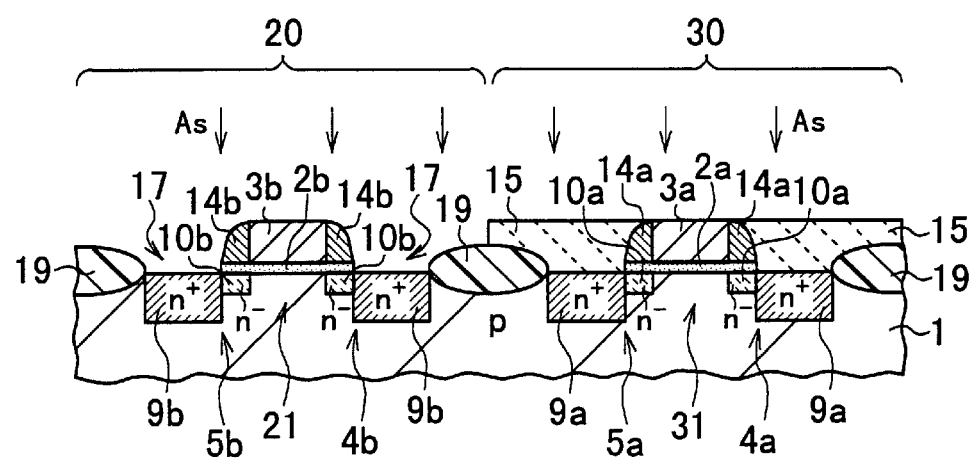
Figure 3F:
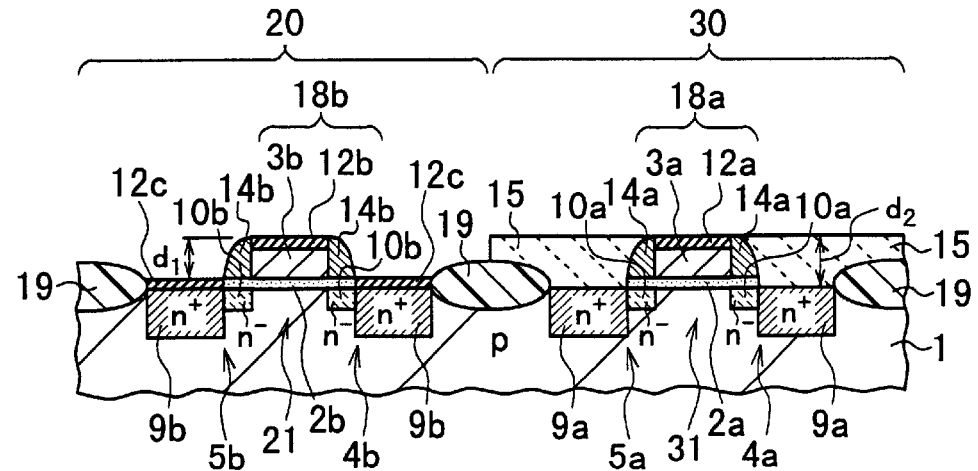

A semiconductor device according to an embodiment of the present invention has the configuration shown in FIG. 3F.

As shown in FIG. 3F, a patterned isolation dielectric 19 is formed on a main surface of a p-type single-crystal Si substrate 1, thereby defining a logic circuit section 20 and a DRAM cell section 30 on the substrate 1.

Practically, it is needless to say that each of the logic circuit section 20 and the DRAM cell section 30 has a lot of MOSFETs. However, to simplify the illustration and explanation, an n-channel MOSFET 21 as one of the MOSFETs provided in the logic circuit section 20 and an n-channel MOSFET 31 provided in the DRAM cell section 30 are illustrated in FIGS. 3A to 3F and explained below.

In the logic circuit section 20, a pair of $n^+$-type diffusion regions 9b and a pair of $n^-$-type diffusion regions 10b are formed in the substrate 1 and at the same time, silicide layers 12c of a refractory metal are formed on the $n^+$-type diffusion regions 9b. Thus, a pair of source/drain regions 4b and 5b with the LDD structure are formed. One of the two diffusion regions 9b located at the right-hand side, the overlying silicide layer 12c, and the adjoining diffusion region 10b form the source/drain region 4b. The other of the two diffusion regions 9b located at the left-hand side, the overlying silicide layer 12c, and the adjoining diffusion region 10b form the source/drain region 5b. Thus, the silicide layers 12c are incorporated in the source/drain regions 4b and 5b in the logic circuit section 20.

A gate insulating layer 2b is formed on the main surface of the substrate 1 between the pair of $n^+$-type diffusion regions 9b. The gate insulating layer 2b is overlapped with the underlying pair of $n^-$-type diffusion regions 10b. A polysilicon layer 3b and a pair of sidewall spacers 14b are formed on the gate insulating layer 2b. The pair of sidewall spacers 14b are located at each side of the polysilicon layer 3b. Further, in addition to the silicide layers 12c formed on the $n^+$-type diffusion regions 9b, a silicide layer 12b is formed on the polysilicon layer 3b to be sandwiched by the sidewall spacers 14b. The silicide layer 12b and the polysilicon layer 3b serve as a gate electrode 18b.

The pair of source/drain regions 4b and 5b, the gate insulating layer 2b, the gate electrode 18b, and the pair of sidewall spacers 14b constitute the MOSFET 21 in the logic circuit section 20. Since the pair of source/drain regions 4b and 5b are formed in self-alignment to the gate electrode 18b, the MOSFET 21 has the Self-aligned silicide (Salicide) structure.

In the DRAM cell section 30, a pair of n$^+$-type diffusion regions 9a and a pair of n$^-$-type diffusion regions 10a are formed in the substrate 1, thereby forming a pair of source/drain regions 4a and 5a with the LDD structure. one of the two diffusion regions 9a located at the right-hand side and the adjoining diffusion region 10a form the source/drain region 4a. The other of the two diffusion regions 9a located at the left-hand side and the adjoining diffusion region 10a form the source/drain region 5a.

Thus, unlike the MOSFET 21 in the logic circuit section 20, the MOSFET 31 in the DRAM cell section 30 has no silicide layers incorporated in the source/drain regions 4a and 5a.

A gate insulating layer 2a is formed on the main surface of the substrate 1 between the pair of n$^+$-type diffusion regions 9a. The gate insulating layer 2a is overlapped with the underlying pairs of diffusion regions 9a and 10a. A polysilicon layer 3a and a pair of sidewall spacers 14a are formed on the gate insulating layer 2a. The pair of sidewall spacers 14a are located at each side of the polysilicon layer 3a. Further, a silicide layer 12a is formed on the polysilicon layer 3a. The silicide layer 12a and the polysilicon layer 3a serve as a gate electrode 18a.

The pair of source/drain regions 4a and 5a, the gate insulating layer 2a, the gate electrode 18a, and the pair of sidewall spacers 14a constitute the MOSFET 31 in the DRAM cell section 30.

Figure 2A:
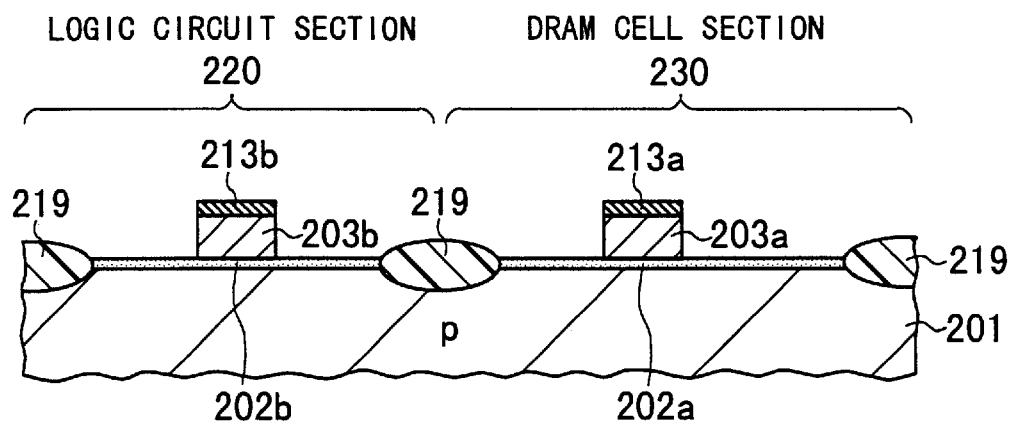
FIGS. 2A to 2C are cross-sectional views showing a fabrication method of another conventional semiconductor device, respectively.
Figure 2B:
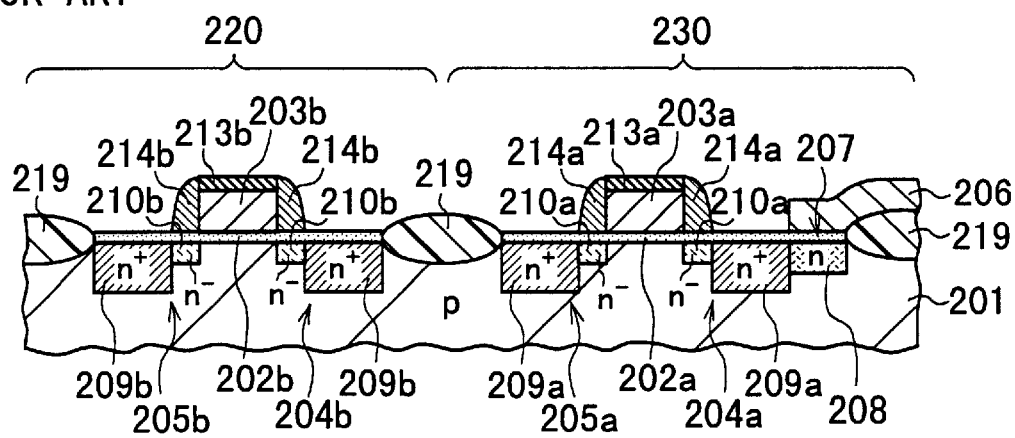
Figure 2C:
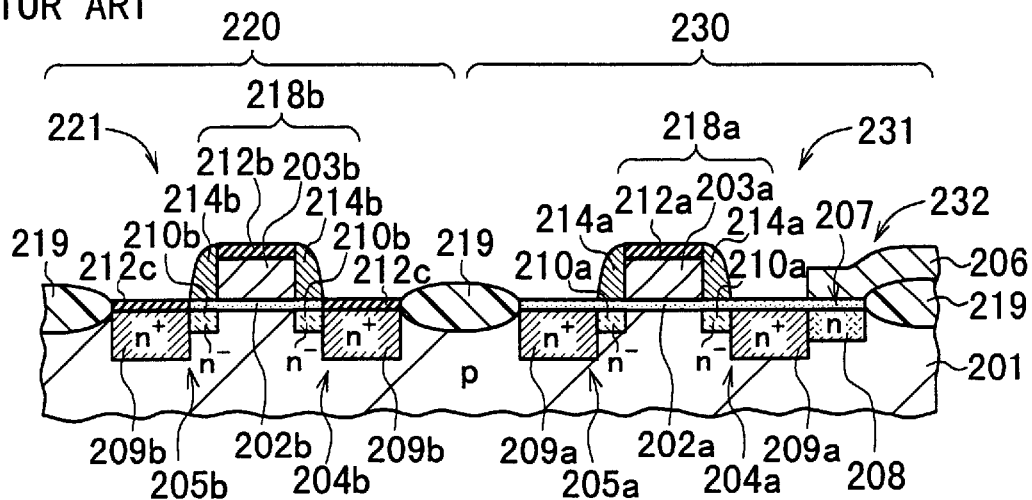

Unlike the conventional device configuration shown in FIG. 2C, no storage capacitor is illustrated in FIG. 3F and explained here. This is because the semiconductor device according to the embodiment of the present invention does not relate to the storage capacitors located in the DRAM cell section 30.

An oxide layer 15 is selectively formed in the DRAM cell section 30 to cover the MOSFET 31. The oxide layer 15 is not overlapped with the logic circuit section 20. The oxide layer 15 is contacted with the pair of n$^+$-type diffusion regions 9a and 9b.

As shown in FIG. 3F, the height $d_1$ of the gate electrode 18b of the MOSFET 21 in the logic circuit section 20 is equal to the height $d_2$ of the gate electrode 18a of the MOSFET 31 in the DRAM cell section 30. The thickness of the oxide layer 15 is equal to the height $d_2$ of the gate electrode 18a.

Although not shown, the MOSFETs 21 and 31 are covered with an interlayer insulating layer and some overlying conductive and/or insulating layers. However, this layered structure is well known and has no relationship with the present invention. Thus, no further explanation is presented here.

Next, a fabrication method of the above-described semiconductor device according to the embodiment of the present invention is explained below with reference to FIGS. 3A to 3F.

First, as shown in FIG. 3A, the isolation dielectric 19 is formed on the main surface of the substrate 1 by a known process, thereby defining the logic circuit section 20 and the DRAM cell section 30 thereon. Then, the gate insulating layers 2a and 2b are respectively formed on the main surface of the substrate 1 in the two sections 20 and 30 by a thermal oxidation process in an oxygen ($O_2$) atmosphere at 700 to 800° C. The layers 2a and 2b have a same thickness of approximately 50 to 100 Å.

Next, an undoped polysilicon layer 11 with a thickness of approximately 1000 to 2000 Å is deposited by a CVD processes to cover the gate insulating layers 2a and 2b and the isolation dielectric 19. Then, a PhosphorSilicate Glass (PSG) layer (not shown) is formed on the polysilicon layer 11 by a coating process and the PSG layer is subjected to a heat treatment process in an nitrogen ($N_2$) atmosphere at 800 to 1000° C., thereby diffusing the phosphorus (P) atoms existing in the PSG layer into the polysilicon layer 11. Thus, the conductivity type of the polysilicon layer 11 is turned to an n-type, thereby lowering the resistivity of the layer 11. Thereafter, the PSG layer is removed by using a hydrogen fluoride (HF) solution.

Instead of the use of the undoped polysilicon layer and the PSG layer, an impurity-doped polysilicon layer doped with an impurity at a doping concentration of approximately $10^{20}$ atoms/cm$^3$ may be formed directly.

Subsequently, using a patterned photoresist film (not shown) covering the logic circuit section 20 as a mask, which is produced by a photolithography process, the polysilicon layer 11 is patterned only in the DRAM cell section 30 to have a plan shape of the gate electrode 18a. The state at this stage is shown in FIG. 3A.

Following this process, phosphors (P) or arsenic (As) is selectively ion-implanted into the substrate 1 in the DRAM cell section 30 with a dose of approximately $10^{13}$ atoms/cm$^2$, as shown in FIG. 3B. In this ion-implantation process, the remaining polysilicon layer 11 serves as a mask preventing the irradiated P or As ions from being introduced into the logic circuit section 20. Therefore, the irradiated P or As ions are introduced into only the DRAM cell section 30, thereby forming the pair of n$^-$-type diffusion regions 10a in self-alignment to the patterned polysilicon layer 3a.

After an oxide layer (approximately 1000 to 1500 Å in thickness) with a good step-coverage property (not shown) is formed to cover the whole substrate 1, the oxide layer is etched back by an anisotropic etching process to form the pair of sidewall spacers 14a on the gate insulating layer 2a. The sidewall spacers 14a are located at each side of the polysilicon layer 3a. Through this etch back process, the gate insulating layer 2a is selectively removed, thereby forming two windows 16 on the substrate 1 at each side of the polysilicon layer 3a, as shown in FIG. 3B. The substrate 1 (i.e., the pair of n$^-$-type diffusion regions 10a) is exposed from the gate insulating layer 2a through the windows 16.

Thereafter, As is selectively ion-implanted into the substrate 1 in the DRAM cell section 30 with a dose of $10^{15}$ atoms/cm$^2$, as shown in FIG. 3C. In this ion-implantation process, the remaining polysilicon layer 11 serves as a mask preventing the irradiated As ions from being introduced into the logic circuit section 20. Therefore, the irradiated As ions are introduced into only the DRAM cell section 30, thereby forming the pair of n$^+$-type diffusion regions 9a in self-alignment to the patterned polysilicon layer 3a and the sidewall spacers 14a. At this time, the inner parts of the n$^-$-type diffusion regions 10a are left unchanged. Thus, the LDD structure of the pair of source/drain regions 4a and 5a is formed by the pair of n$^-$-type diffusion regions 10a and the pair of n$^+$-type diffusion regions 9a in the DRAM cell section 30, as shown in FIG. 3C.

The LDD structure of the source/drain regions 4a and 5a is not always necessary. If the LDD structure is not used, the step of forming the sidewall spacers 14a and the step of later implanting the As ions are unnecessary.

Subsequently, the oxide layer 15 with a thickness of approximately 3000 to 5000 Å is formed to cover the whole substrate 1 by a High-Density Plasma CVD (PDPCVD) process or the like. A BoroPhosphorSilicate Glass (BPSG) layer may be used as the oxide layer 15. The oxide layer 15 is contacted with the substrate 1 through the windows 16, as shown in FIG. 3C.

To decrease the thickness of the oxide layer 15 until the top of the polysilicon layer 3a in the DRAM cell section 30 and the unprocessed polysilicon layer 11 in the logic circuit section 20 are exposed, the surface of the oxide layer 15 is polished by a Chemical Mechanical Polishing (CMP) process. Thus, the oxide layer 15 is removed in the whole logic circuit section 20 and at the same time, it is left in the whole DRAM cell section 30, as shown in FIG. 3C. Also, the planarized surface of the remaining oxide layer 15 in the section 30 is in the same plane as that of the polysilicon layer 11 in the section 20.

The remaining oxide layer 15 in the DRAM cell section 30 serves as a mask covering the DRAM cell section 30 in the following process steps of forming the MOSFET 21 in the logic circuit section 20. The state at this stage is shown in FIG. 3C.

Instead of the CMP process, a RIS process may be used therefor. In this case, after the oxide layer 15 with a thickness of approximately 3000 to 5000 Å is formed to cover the whole substrate 1, the oxide layer 15 is planarized by a heat treatment process in a $N_2$ atmosphere at 800 to 1200° C. As the oxide layer 15, a BPSG layer is preferably used, because it has a thermal flowability. Then, the oxide layer 15 is etched back by an RIE process in the same way as above under the condition that the mixture of $C_4F_8$, Ar and $O_2$ gases is used as an etching gas and the supplying power is set as 1000 to 3000 kW.

To ensure the exposure of the polysilicon layer 11, it is preferred that a wet etching process of removing the oxide layer 15 using a HF solution is additionally carried out at this stage.

Subsequently, using a patterned photoresist film (not shown) covering the DRAM cell section 30 as a mask, which is produced by a photolithography process, the unprocessed polysilicon layer 11 is patterned only in the logic circuit section 20 to have a plan shape of the gate electrode 18b. The state at this stage is shown in FIG. 3D.

Following this process, P or As is selectively ion-implanted into the substrate 1 in the logic circuit section 20 with a dose of approximately $10^{13}$ atoms/cm$^2$, as shown in FIG. 3E. In this ion-implantation process, the remaining oxide layer 15 serves as a mask preventing the irradiated P or As ions from being introduced into the substrate 1. Therefore, the irradiated P or As ions are introduced into only the logic circuit section 20, thereby forming the pair of n$^-$-type diffusion regions 10b in self-alignment to the patterned polysilicon layer 3b.

After an oxide layer (approximately 1000 to 1500 Å in thickness) with a good step-coverage property (not shown) is formed to cover the whole substrate 1, the oxide layer is etched back by an anisotropic etching process to form the pair of sidewall spacers 14b on the gate insulating layer 2b. The sidewall spacers 14b are located at each side of the polysilicon layer 3b. Through this etch back process, the gate insulating layer 2b is selectively removed, thereby forming two windows 17 on the substrate 1 at each side of the polysilicon layer 3b, as shown in FIG. 3E. The substrate 1 is exposed from the gate insulating layer 2b through the windows 17.

Thereafter, As is selectively ion-implanted into the substrate 1 in the logic circuit section 20 with a dose of $10^{15}$ atoms/cm$^2$, as shown in FIG. 3E. In this ion-implantation process, the remaining oxide layer 15 serves as a mask preventing the irradiated As ions from being introduced into the substrate 1. Therefore, the irradiated As ions are introduced into only the logic circuit section 20, thereby forming the pair of n$^+$-type diffusion regions 9b in self-alignment to the patterned polysilicon layer 3b and the sidewall spacers 14b. At this time, the inner parts of the n$^-$-type diffusion regions 10b are left unchanged. Thus, the LDD structure of the pair of source/drain regions 4b and 5b is formed by the pair of n$^-$-type diffusion regions 10b and the pair of n$^+$-type diffusion regions 9b in the logic circuit section 20, as shown in FIG. 3E.

Thereafter, a refractory metal layer (not shown) such as Ti, W, Mo, Co, and Ni is formed by a sputtering process to cover the whole substrate 1, in which the refractory metal layer is contacted with the surfaces of the n$^+$-type diffusion regions 9b through the windows 17. The substrate 1 with the refractory metal layer is subjected to a heat treatment process at approximately 600° C. to cause a silicidation reaction between the substrate 1 made of Si and the refractory metal layer. Thus, the silicide layers 12c are respectively formed on the n$^+$-type diffusion regions 9b and at the same time, the silicide layers 12a and 12b are respectively formed on the polysilicon layers 3a and 3b, as shown in FIG. 3F.

After the unreacted refractory metal layer is removed, finally, the substrate 1 with the silicide layers 12a, 12b, and 12c is subjected to a heat treatment process again at approximately 900° C., thereby causing a phase transition of the layers 12a, 12b, and 12c. As a result, the electric resistance of the silicide layers 12a, 12b, and 12c is lowered.

Through the above-described process steps, the configuration of the semiconductor device according to the embodiment is obtained.

With the semiconductor device according to the embodiment of the present invention, as described above, the silicide layers 12c are respectively incorporated in the pair of source/drain regions 4b and 5b of the MOSFET 21 in the logic circuit section 20, and the silicide layer 12b is incorporated in the gate electrode 18b thereof. At the same time as this, the silicide layer 12a is incorporated in the gate electrode 18a of the MOSFET 31 in the DRAM cell section 30 while no silicide layers are incorporated in the pair of source/drain regions 4a and 5a thereof.

Therefore, even if the semiconductor device according to the embodiment is further miniaturized, the MOSFET 21 in the logic circuit section 20 is capable of high-speed operation and the junction current leakage of the MOSFET 31 in the DRAM cell section 30 can be suppressed.

Also, the MOSFET 31 in the DRAM cell section 30 is formed while covering the logic circuit section 20 with the remaining polysilicon layer 11, and then, the MOSFET 21 in the logic circuit section 20 is formed while covering the DRAM cell section 30 with the oxide layer 15. Therefore, the semiconductor device according to the embodiment can be realized by the use of two lithography process in the patterning processes of the polysilicon layer 11 shown in FIGS. 3A and 3D. Thus, the number of necessary lithography processes can be decreased compared with the conventional method shown in FIGS. 2A to 2C.

Moreover, since the MOSFET 21 in the logic circuit section 20 and the MOSFET 31 in the DRAM cell section 30 are formed in the separate process steps, the gate electrodes 18a and 18b of the MOSFETs 21 and 31 can be formed at desired high accuracy even if the semiconductor device is further miniaturized.

According to the inventor's test, it was found that a typical fabrication period of time of the conventional fabrication method shown in FIGS. 2A to 2C was 60 hours, and that a typical fabrication period of time of the fabrication method of the semiconductor device according to the embodiment was 40 hours. Thus, it was found that the typical fabrication time was, for example, decreased from 60 hours to 40 hours, even if the step of forming the oxide layer 15 and the step of planarizing the oxide layer 15 are added.

In the above-described embodiment, the logic circuit section 20 and the DRAM cell section 30 are applied. However, the present invention is not limited thereto. It is sufficient that the semiconductor device is equipped with at least two any sections necessitating different electric characteristics or performance of built-in electronic elements/circuits.

While the preferred form of the present invention has been described, it is to be understood that modifications will be apparent to those skilled in the art without departing from the spirit of the invention. The scope of the invention, therefore, is to be determined solely by the following claims

What is claimed is:

1. A fabrication method of a semiconductor device, comprising the steps of:
   (a) defining a first section and a second section on a main surface of a semiconductor substrate;
   (b) forming a first gate insulating layer on said main surface of said substrate in said first section and a second gate insulating layer on said main surface of said substrate in said second section;
   (c) forming a conductive layer on said first and second gate insulating layers to cover said first and second sections;
   (d) patterning said conductive layer in said first section, thereby forming a first gate electrode on said first gate insulating layer in said first section without forming any gate electrode in said second section;
   (e) forming a first pair of source/drain regions in said first section at each side of said first gate electrode, thereby constituting a first MOSFET in said first section;
   (f) selectively forming a dielectric masking layer to cover said first section while uncovering said second section;
   (g) patterning said remaining conductive layer in said second section while masking said first section by said masking layer, thereby forming a second gate electrode on said second gate insulating layer in said second section;
   (h) forming a second pair of source/drain regions in said second section at each side of said second gate electrode, thereby constituting a second MOSFET in said second section;
   (i) forming a refractory metal layer to cover said first and second sections in such a way that said refractory metal layer is contacted with said second pair of source/drain regions in said second section; and
   (j) heat-treating said substrate with said refractory metal layer to form a pair of silicide layers on said second pair of source/drain regions in said second section due to silicidation reaction of said refractory metal with said second pair of source/drain regions.

2. The method as claimed in claim 1, wherein said step (f) is carried out by a substep of forming said masking layer to cover said whole substrate, and a substep of planarizing said masking layer until a top of said first gate electrode of said first MOSFET is exposed from said masking layer.

3. The method as claimed in claim 1, wherein said step (f) is carried out in such as way that a top of said first gate electrode of said first MOSFET is located in substantially a same plane as a surface of said masking layer.

4. The method as claimed in claim 1, wherein said step (h) is carried out in such as way that a top of said masking layer is located in substantially a same plane as a top of said second gate electrode of said second MOSFET.

5. The device as claimed in claim 1, wherein said first section is a DRAM cell section and said second section is a logic circuit section.

* * * * *